(12) United States Patent
Takada et al.

(10) Patent No.: US 8,528,200 B2
(45) Date of Patent: Sep. 10, 2013

(54) PRINTED WIRING BOARD AND METHOD FOR MANUFACTURING PRINTED WIRING BOARD

(75) Inventors: Masaru Takada, Ogaki (JP); Fusaji Nagaya, Ogaki (JP); Takao Okada, Ogaki (JP); Tomohiko Murata, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 335 days.

(21) Appl. No.: 12/915,582

(22) Filed: Oct. 29, 2010

(65) Prior Publication Data

US 2011/0147057 A1    Jun. 23, 2011

Related U.S. Application Data

(60) Provisional application No. 61/287,958, filed on Dec. 18, 2009.

(51) Int. Cl.
*H05K 3/02* (2006.01)

(52) U.S. Cl.
USPC ............................................. 29/846; 174/260

(58) Field of Classification Search
USPC .... 174/260, 261; 361/767–771; 29/846–849
See application file for complete search history.

(56) References Cited

U.S. PATENT DOCUMENTS

| | | | | |
|---|---|---|---|---|
| 6,809,415 | B2 * | 10/2004 | Tsukada et al. | 257/693 |
| 7,098,407 | B2 * | 8/2006 | Kim et al. | 174/257 |
| 7,817,441 | B2 * | 10/2010 | Hsu | 361/767 |
| 2011/0136298 | A1 * | 6/2011 | Kikuchi et al. | 438/121 |

FOREIGN PATENT DOCUMENTS

JP     2007-103868     4/2007

* cited by examiner

*Primary Examiner* — Jeremy Norris
(74) *Attorney, Agent, or Firm* — Oblon, Spivak, McClelland, Maier & Neustadt, L.L.P.

(57) ABSTRACT

A method for manufacturing a printed wiring board includes forming a pad for mounting an electronic component on a resin layer, forming a solder-resist layer on the resin layer and the pad, exposing an upper surface of the pad and a portion of a side wall of the pad from the solder-resist layer, and forming a metal layer on the upper surface of the pad and the portion of the side wall of the pad.

19 Claims, 10 Drawing Sheets

PRINTED WIRING BOARD AND METHOD FOR MANUFACTURING PRINTED WIRING BOARD

CROSS-REFERENCE TO RELATED APPLICATIONS

The present application claims the benefits of priority to U.S. Application No. 61/287,958, filed Dec. 18, 2009. The contents of that application are incorporated herein by reference in their entirety.

BACKGROUND OF THE INVENTION

1. Field of the Invention

The present invention relates to a printed wiring board having pads for mounting electronic components such as a semiconductor chip and to a method for manufacturing such a printed wiring board.

2. Discussion of the Background

Japanese Laid-Open Patent Publication No. 2007-103868 describes exposing wire-bonding pads by solder-resist layers. Nickel plating and gold plating are formed on the bonding pads. Electroless plating and electrolytic plating are disclosed for forming such nickel plating and gold plating. The contents of this publication are incorporated herein by reference in their entirety.

SUMMARY OF THE INVENTION

According to one aspect of the present invention, a method for manufacturing a printed wiring board includes forming a pad for mounting an electronic component on a resin layer, forming a solder-resist layer on the resin layer and the pad, exposing an upper surface of the pad and a portion of a side wall of the pad from the solder-resist layer, and forming a metal layer on the upper surface of the pad and the portion of the side wall of the pad.

According to another aspect of the present invention, a printed wiring board has a resin layer, multiple pads formed on the resin layer and positioned to mount an electronic component, a solder-resist layer formed on the resin layer and exposing the upper surfaces of the pads and portions of side walls of the pads, and a metal layer formed on the upper surfaces of the pads and the side walls of the pads exposed by the solder-resist layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

The embodiments will now be described with reference to the accompanying drawings, wherein like reference numerals designate corresponding or identical elements throughout the various drawings.

Figure 4:
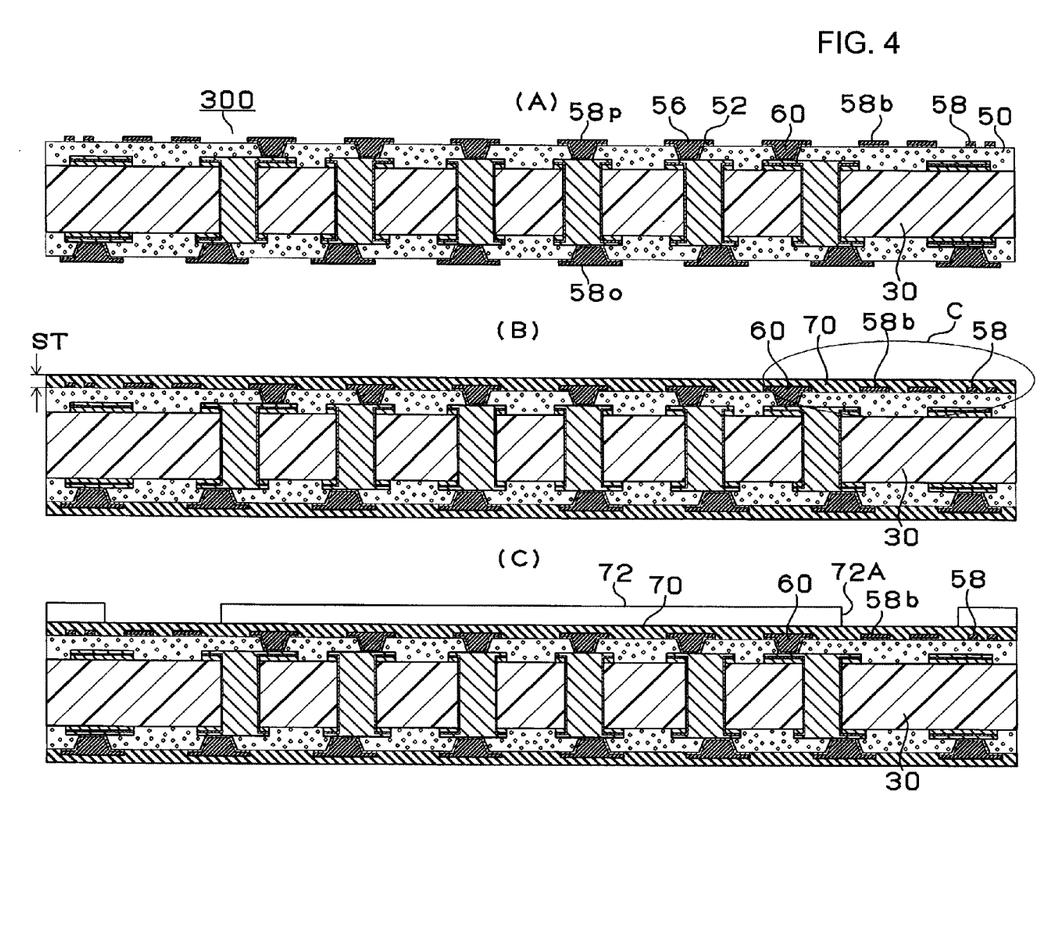
FIG. 4 are views showing the steps for manufacturing a printed wiring board according to the embodiment.
Figure 5:
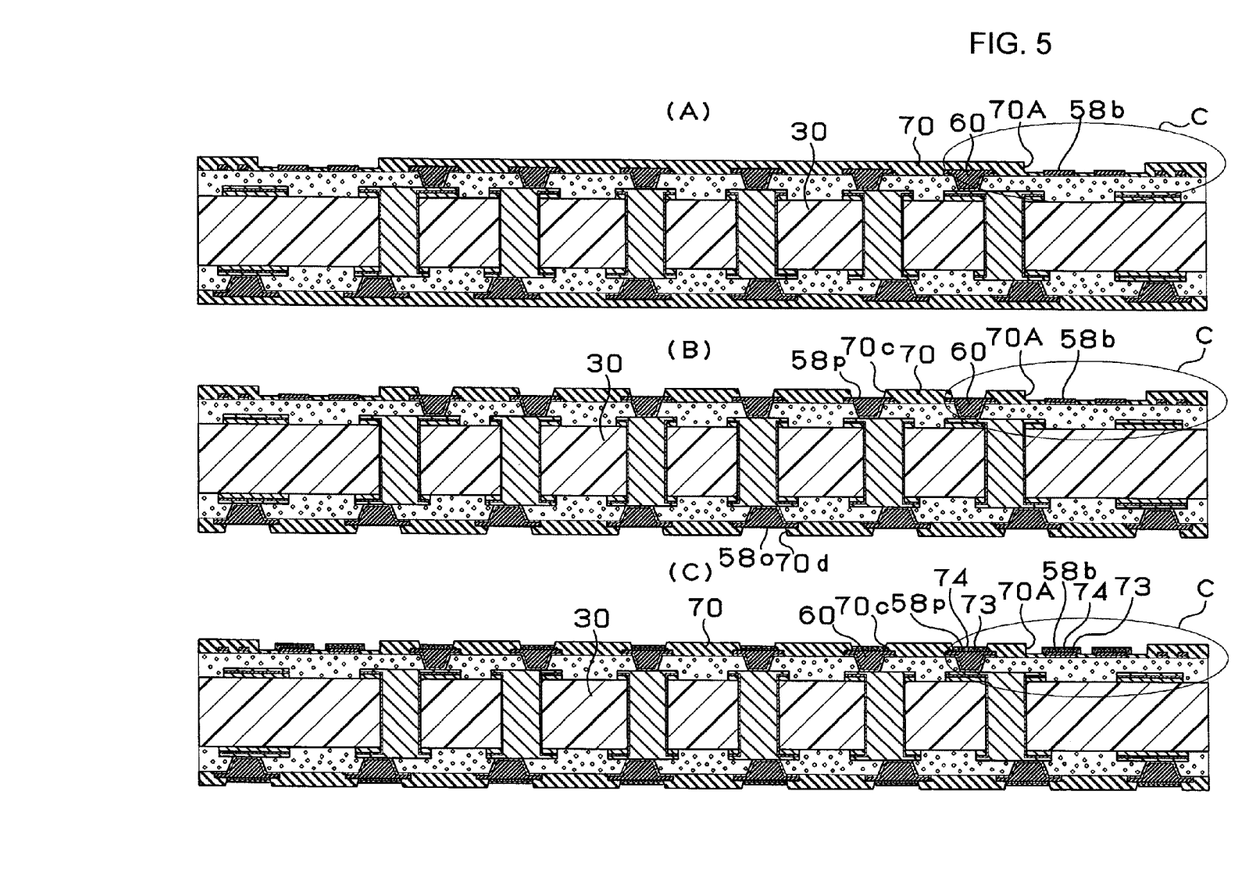
FIG. 5 are views showing the steps for manufacturing a printed wiring board according to the embodiment.
Figure 6:
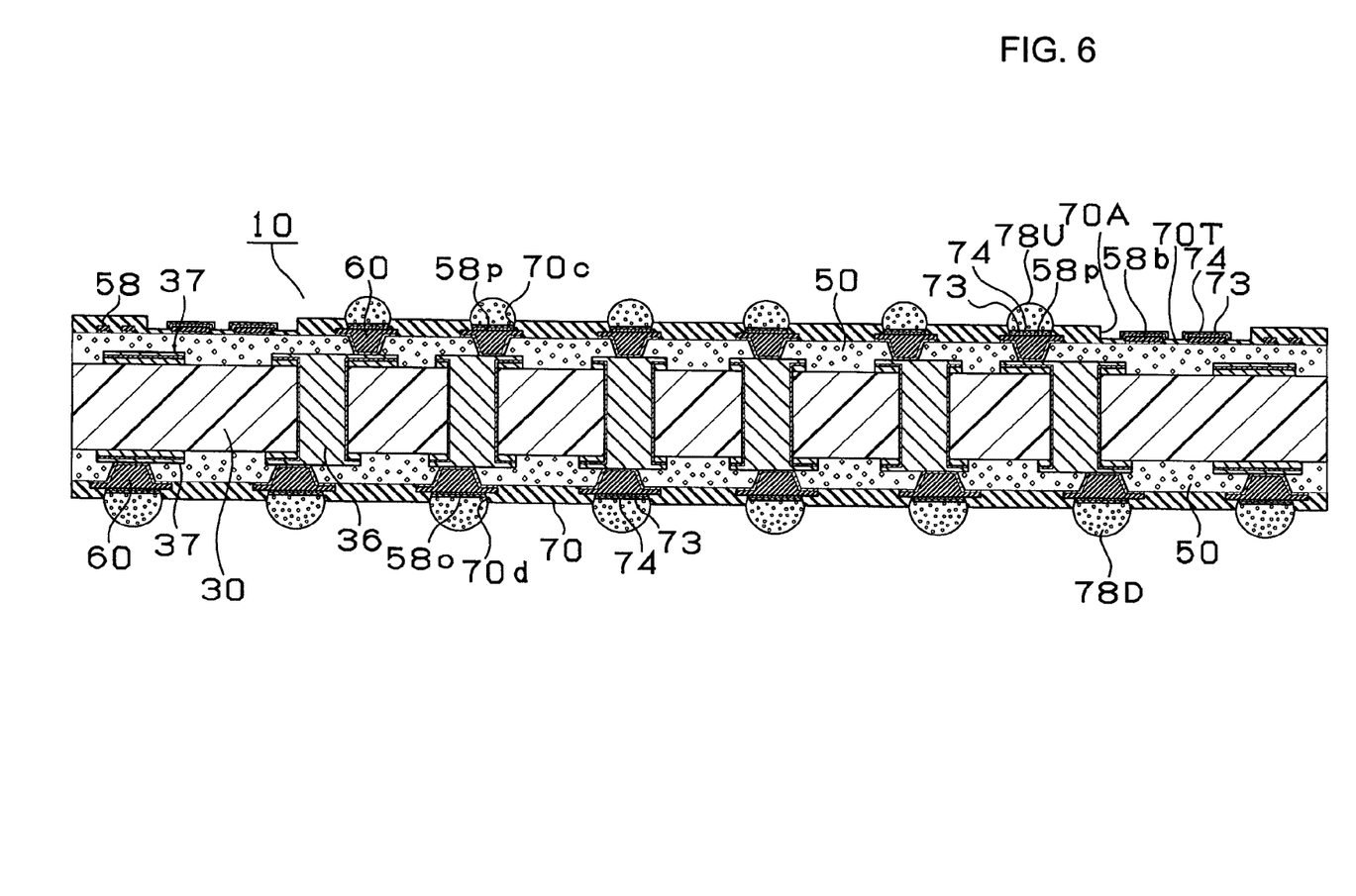
FIG. 6 is a cross-sectional view of a printed wiring board according to the embodiment.

A printed wiring board according to an embodiment and its manufacturing method are described with reference to FIGS. 1-9. FIG. 6 is a cross-sectional view showing a printed wiring board according to the embodiment. In printed wiring board 10, conductive circuits 37 are formed on the upper surface and the lower surface of core substrate 30, and conductive circuits 37 on the upper and lower surfaces are connected by through-hole conductors 36. In addition, on core substrate 30 and conductive circuits 37, resin layers 50 are formed as interlayer resin insulation layers. Filled vias 60 are formed in the interlayer resin insulation layers. Also, conductive circuits 58, solder pads (58p) and pads (58b) are formed on the interlayer resin insulation layers. Solder-resist layers 70 having opening portions (70A, 70c) are formed on filled vias 60, conductive circuits 58 and interlayer resin insulation layers 50.

Upper-surface-side solder-resist layer 70 has opening (70c) to partially expose a solder pad and opening (70A) to simultaneously expose multiple pads (58b). The periphery of a solder pad is covered with solder resist. Solder bump (78U) is formed on solder pad (58p) with nickel layer 73 and gold layer 74 therebetween. In the same manner, the upper surface of a via conductor and a conductive circuit exposed through opening (70d) in lower-surface-side solder-resist layer 70 form external terminal (58o), and solder bump (78D) to be connected to another board is formed on external terminal (58o) with nickel layer 73 and gold layer 74 therebetween.

Each opening (70c) exposes a solder pad. One opening (70A) exposes multiple pads (58b). The upper surface of solder pad (58p) is partially exposed through opening (70c) in the solder resist. The upper surfaces and part of side walls of pads (58b) are exposed through opening (70A) in the solder resist. The side wall of pad (58b) exposed through opening (70A) in the solder resist is a portion extended from the upper surface of pad (58b). The entire upper surface of pad (58b) is exposed. A portion of the solder-resist layer is formed between pad (58b) and pad (58b). The thickness of the solder-resist layer formed between pad (58b) and pad (58b) is less than the thickness of pad (58b). The thickness of the solder-resist layer formed between pad (58b) and pad (58b) is less than the thickness of the solder-resist layer formed between conductive circuit 58 and conductive circuit 58. The thickness of the solder-resist layer formed between pad (58b) and pad (58b) is less than the thickness of the solder-resist layer formed between solder pad (58p) and solder pad (58p). A metal layer is formed on the surfaces of pads (58b) and solder pads (58p) exposed by the solder resist layer. An example of such a metal layer may be formed with a nickel layer and a gold layer on the nickel layer. Another example may be a metal layer formed with a nickel layer, a palladium layer on the nickel layer and a gold layer on the palladium layer, or a metal layer formed with a tin layer.

Figure 7:
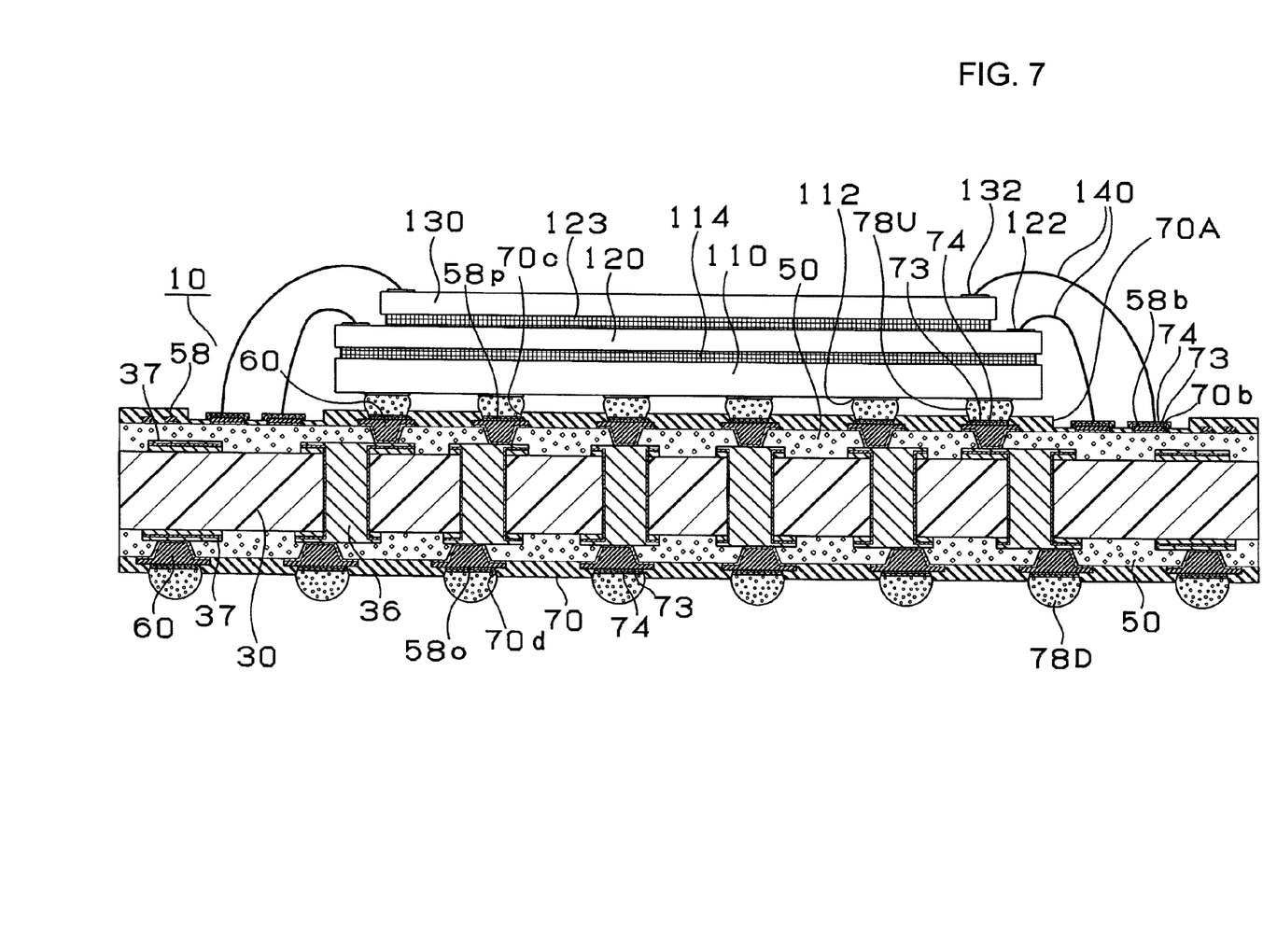
FIG. 7 is a cross-sectional view showing a state where semiconductor chips are mounted on a printed wiring board of the embodiment.

FIG. 7 shows an example in which electronic components such as a semiconductor chip and a memory are mounted on a printed wiring board of the embodiment. Semiconductor chip 110 is mounted on solder pads of printed wiring board 10 by means of solder bumps (78U). Semiconductor chip 110 is flip-chip mounted on printed wiring board 10. Semiconductor chip 120 is mounted on semiconductor chip 110 by means of adhesive 114, and memory 130 is mounted on semiconductor chip 120 by means of adhesive 123. Semiconductor chip 120 and memory 130 are mounted on pads (58b) of printed wiring board 10 by means of wires 140. Semiconductor chip 120 and memory 130 are connected to printed wiring board 10 by wire bonding. In the present embodiment, pads (58b) work as pads for wire bonding (bonding pads).

In the present embodiment, the upper surfaces of bonding pads (58b) are exposed by solder-resist layer 70, and are positioned higher than upper surface (70T) of the solder-resist layer which surrounds the bonding pads. In addition, interlayer resin insulation layer 50 which exists between the bonding pads is covered with solder-resist layer 70. Thus, when wires are connected to pads (58b), the solder-resist layer may seldom interfere with the connection. Also, when a metal layer is formed on the pads, such a metal layer will not be formed on the interlayer resin insulation layer between pads. Short circuiting caused by the metal layer will seldom occur between adjacent pads (58b). In the present embodiment, connection reliability will be enhanced between the wires and pads. In the present embodiment, although multiple pads (58b) are exposed through an opening (70A) formed in a solder-resist layer, the distance between pad (58b) and pad (58b) may be set shorter. Even when the insulation distance between pads (58b) is set shorter and bonding pads are positioned with a fine pitch, short-circuiting will seldom occur between the bonding pads.

In the following, the steps for manufacturing a printed wiring board shown in FIG. 6 are described.

Figure 1:
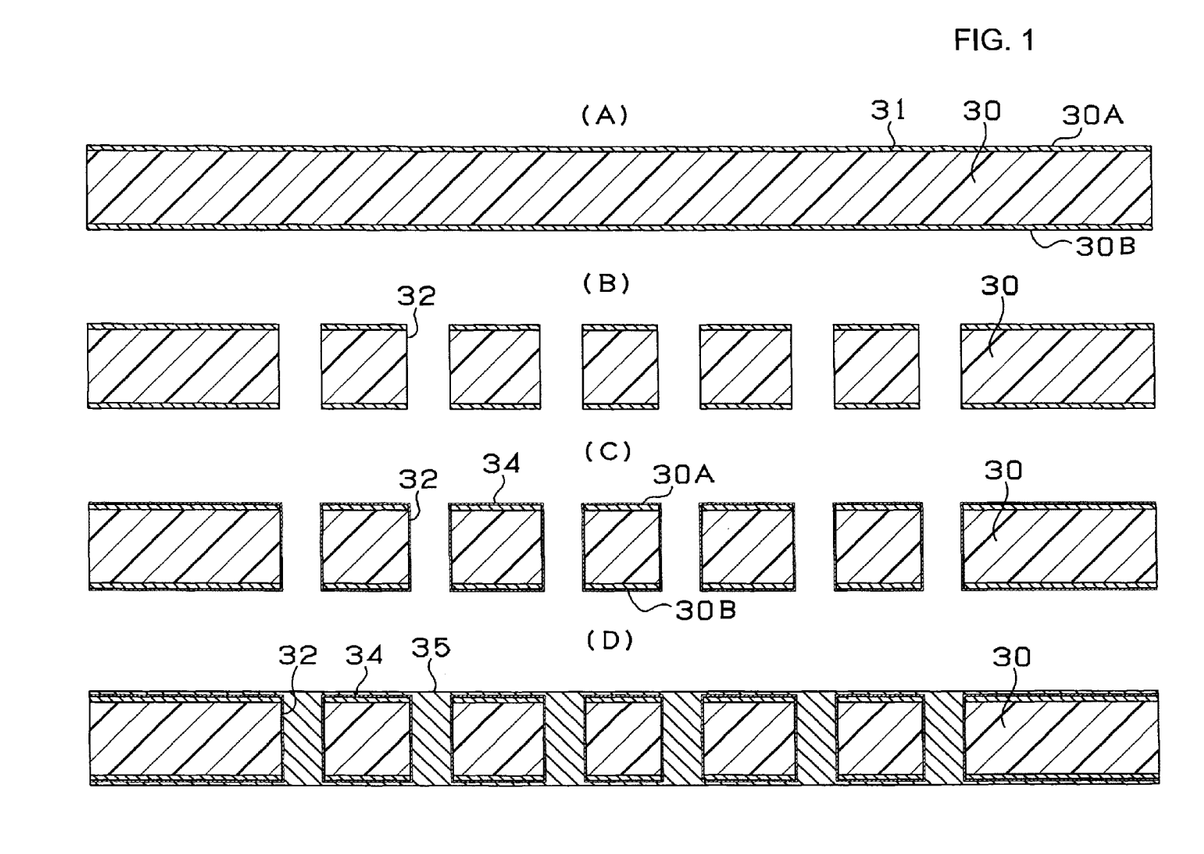
FIG. 1 are views showing the steps for manufacturing a printed wiring board according to an embodiment of the present invention.

(1) Double-sided copper-clad laminate 31 with a thickness of 0.1-0.8 mm is prepared (FIG. 1(A)). Insulative substrate (core substrate) 30 of double-sided copper-clad laminate 31 is made of epoxy resin or BT (bismaleimide triazine) resin and a core material such as glass cloth. Copper foils (30A, 30B) are laminated on a first surface of core substrate 30 and on a second surface opposite the first surface. First, penetrating holes 32 for through-hole conductors are formed in the double-sided copper-clad laminate using a drill or a laser (FIG. 1(B)).

(2) Then, a catalyst is attached to the surfaces of the double-sided copper-clad laminate and to the inner-wall surfaces of penetrating holes 32 for through-hole conductors (not shown in the drawings). Next, electroless plated film made of copper, nickel or the like is formed on the first and second surfaces of the core substrate and the penetrating holes for through-hole conductors. Specifically, by immersing the core substrate in a commercially available electroless copper-plating solution (such as THRU-CUP made by C. Uyemura & Co., Ltd.), 0.3-3.0 μm-thick electroless copper-plated film 34 is formed on the substrate surfaces and the inner walls of the penetrating holes (FIG. 1(C)).

(3) Next, electrolytic plated film made of copper, nickel or the like is formed on the electroless plated films. In particular, the core substrate is immersed in an electrolytic copper-plating solution with the following composition to form electrolytic plated film 35 on both surfaces of the core substrate and inside the penetrating holes under the following conditions (FIG. 1(D)). The penetrating holes for through-hole conductors are filled with electrolytic plated film. The penetrating holes for through-hole conductors are preferred to be filled with electrolytic copper-plated film.

| electrolytic plating solution | |
|---|---|
| sulfuric acid | 0.5 mol/l |
| copper sulfate | 0.8 mol/l |
| iron sulfate-heptahydrate | 5 g/l |
| leveling agent | 50 mg/l |
| brightener | 50 mg/l |
| electrolytic plating conditions | |
| current density | 1 A/dm$^2$ |
| time | 65 minutes |
| temperature | 22 ± 2° C. |

Figure 2:
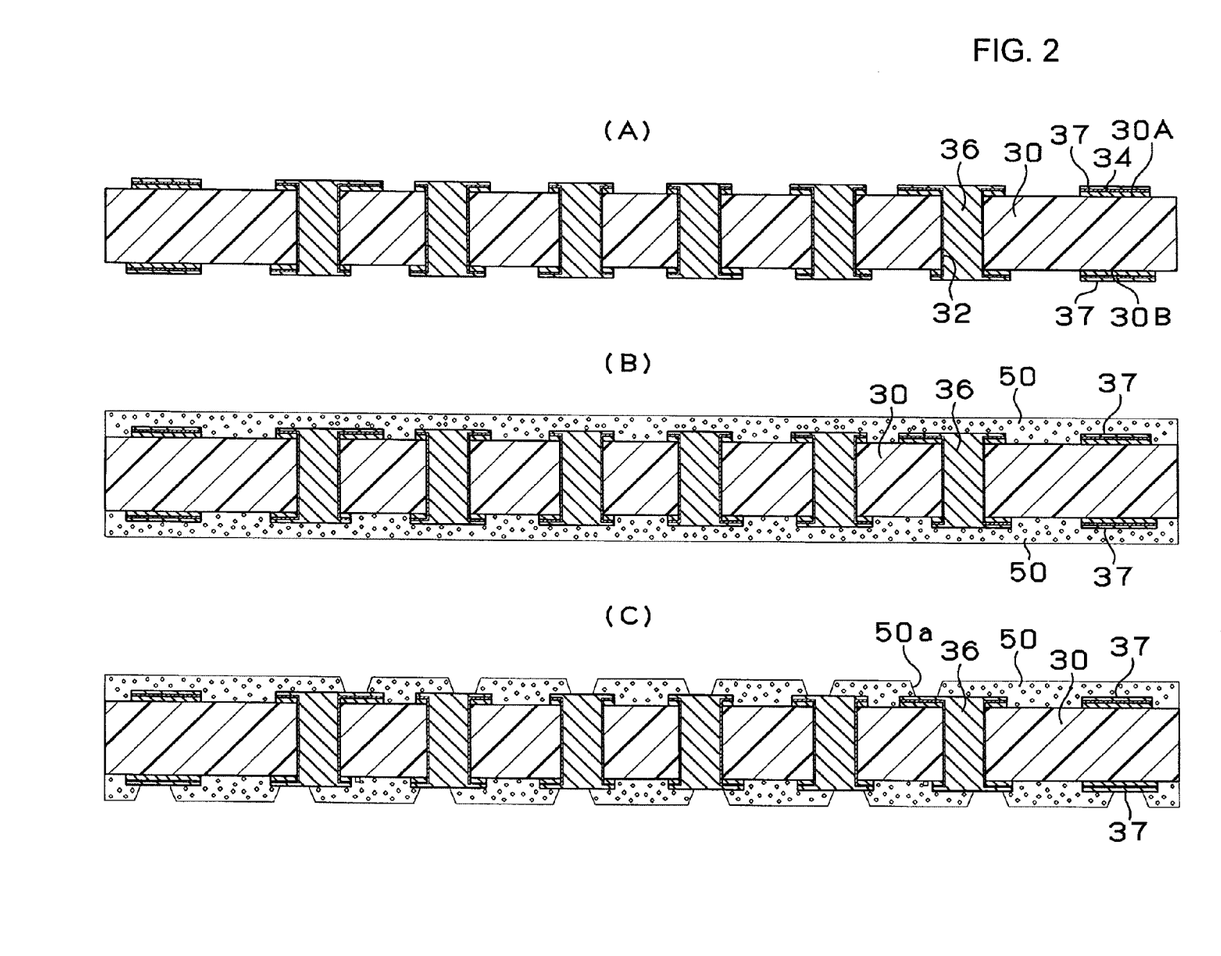
FIG. 2 are views showing the steps for manufacturing a printed wiring board according to the embodiment.

(4) An etching resist with a predetermined pattern is formed on electrolytic plated films 35. Electrolytic plated films 35, electroless plated films 34 and copper foils (30A, 30B) left exposed by the etching resists are removed by etching, and through-hole conductors 36 and conductive circuits 37 are formed (FIG. 2(A)). Then, the entire surface of conductive circuits 37 and the upper surfaces of through-hole conductors 36 are roughened (not shown in the drawings).

Forming Built-Up Layers (5) Resin film for interlayer resin insulation layers (brand name: ABF-45SH, made by Ajinomoto) is laminated on both surfaces of core substrate 30. Then, by curing the resin film for interlayer resin insulation layers, resin layer 50 as an interlayer resin insulation layer is formed on both surfaces of the core substrate (FIG. 2(B)).

(6) Next, using a $CO_2$ gas laser, via-conductor openings (50a) with a 40-80 μm diameter are formed in the interlayer resin insulation layers (FIG. 2(C)). Substrate 30 having via-conductor openings (50a) is immersed for 10 minutes in an 80° C. solution containing 60 g/l permanganic acid to roughen the surfaces of interlayer resin insulation layers 50 including the inner walls of via-conductor openings (50a) (not shown in the drawings).

(7) Next, substrate 30 is immersed in a neutralizer (made by Shipley Company, LLC) and then washed with water. Furthermore, a catalyst is attached to the surfaces of interlayer resin insulation layers 50 and the inner-wall surfaces of via-conductor openings (50a) (not shown in the drawings).

Figure 3:
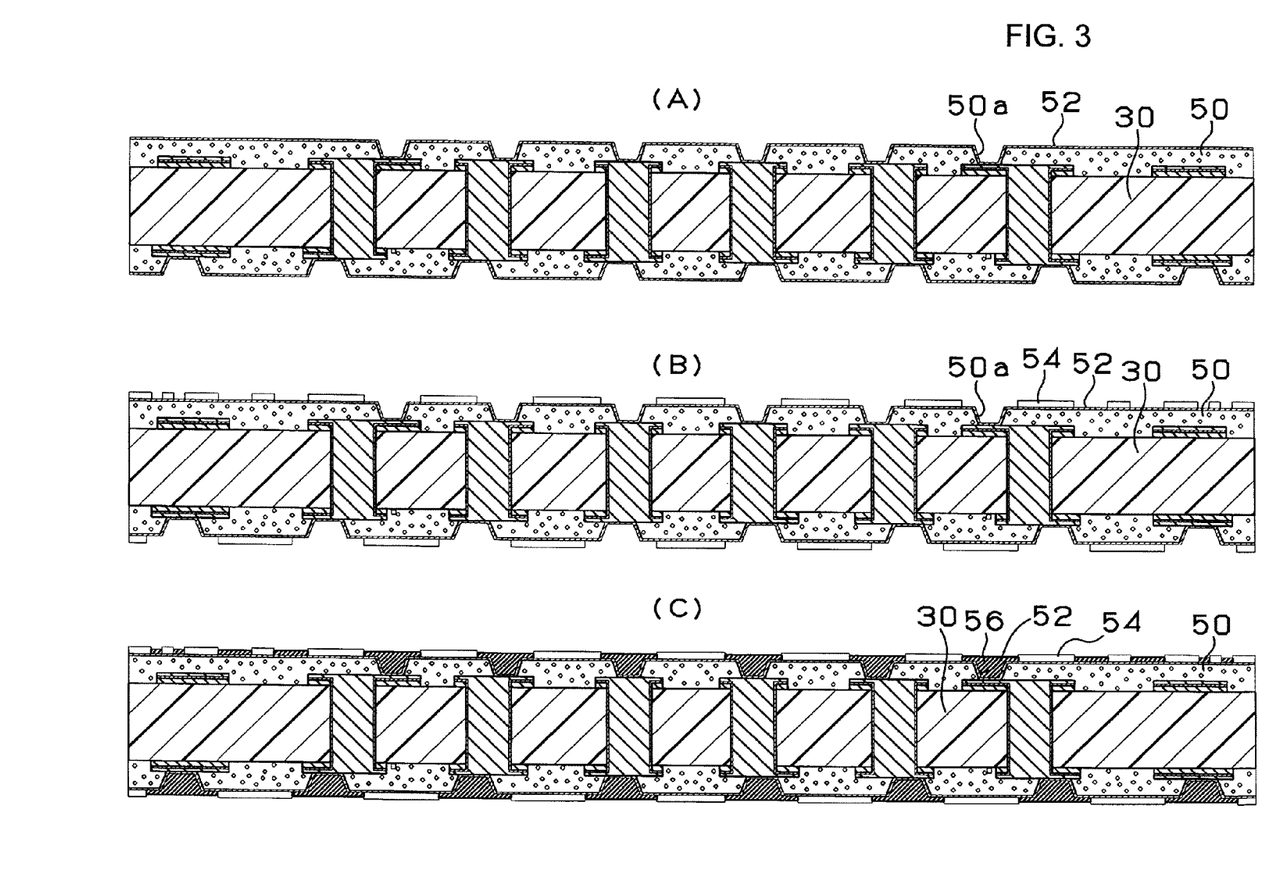
FIG. 3 are views showing the steps for manufacturing a printed wiring board according to the embodiment.

(8) Next, the substrate is immersed in a commercially available electroless plating solution to form 0.3-3.0 μm-thick electroless plated film 52 on the surfaces of the interlayer resin insulation layers and the inner walls of the via-conductor openings (FIG. 3(A)). As an example for electroless plated film, copper, nickel or the like may be used. The electroless plated film in the present embodiment is electroless copper-plated film. Instead of electroless plated film, deposition films such as sputtered film may be formed on interlayer resin insulation layers and via-conductor openings.

(9) Next, plating resist 54 with a predetermined pattern is formed on electroless copper-plated films 52 (FIG. 3(B)).

(10) The substrate is immersed in an electrolytic copper plating solution the same as in above (3). Electrolytic copper-plated film 56 is formed on electroless copper-plated films left exposed by the plating resists under substantially the same conditions as above (3) (FIG. 3(C)). Via-conductor openings are filled with electrolytic plated film 56. Instead of electrolytic copper-plated film, electrolytic nickel film or electrolytic solder film may also be formed. The thickness of electrolytic plated film is set at 10-20 μm.

(11) The plating resists are removed and electroless copper-plated films 52 between portions of electrolytic copper-plated film are removed by etching. Independent upper-layer conductive circuits 58, pads (58b), solder pads (58p, 58o) and filled vias 60 are formed (FIG. 4(A)). The filled vias and conductive circuits may also function as pads (58b) and solder pads (58p, 58o). Then, the surfaces of upper-layer conductive circuits 58, pads (58b), solder pads (58p, 58o) and filled vias 60 are roughened (not shown in the drawings).

Figure 8:
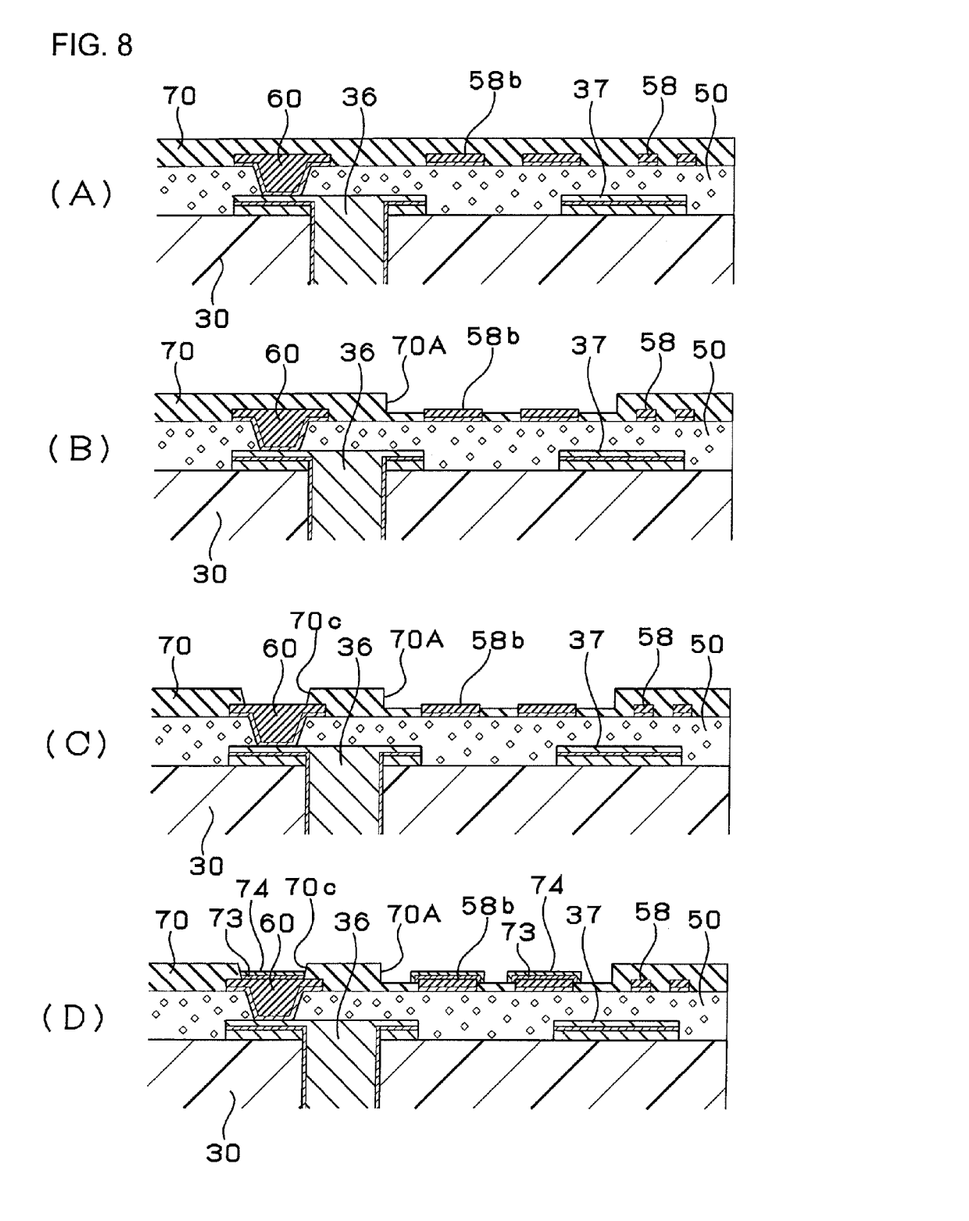
FIG. 8 are magnified cross-sectional views showing the printed wiring board in FIGS. 4(B) and 5.
Figure 9:
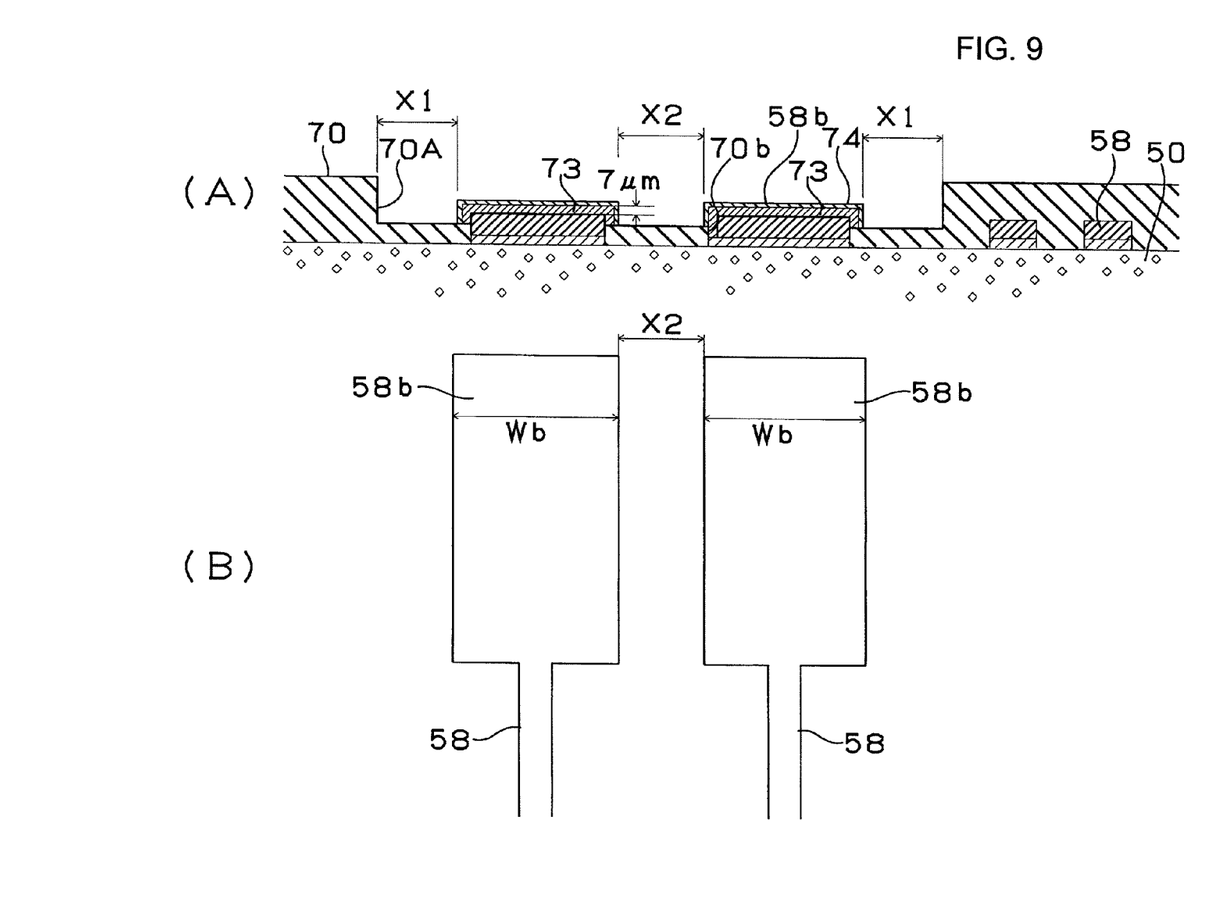
FIG. 9(A) is a further magnified cross-sectional view of the pad shown in FIG. 8(D)
FIG. 9(B) is a plan view of the pad shown in FIG. 9(A)

(12) Next, on both surfaces of multilayer wiring substrate 300, commercially available solder-resist composition (such as SR7200 made by Hitachi Chemical Co., Ltd.) 70 is applied to be 15-35 μm thick (FIG. 4(B)), and a drying process is conducted under the conditions of 70° C. for 20 minutes and 70° C. for 30 minutes. Moreover, a heating process is conducted under the conditions of 80° C. for an hour, 100° C. for an hour, 120° C. for an hour and 150° C. for three hours respectively to cure the solder-resist composition. Solder-resist layers are formed. Thickness (ST) of solder-resist layers (the thickness from the upper surface of the resin layer to the upper surface of the solder-resist layer) is set at approximately 15-35 μm. A magnified view of circled portion "C" in FIG. 4(B) is shown in FIG. 8(A).

(13) Next, mask 72 with opening (72A) positioned in an area corresponding to pads (58b) is placed (FIG. 4(C)). A metal mask or resin mask may be used for such a mask. Then, by blasting an abrasive such as sand, alumina or glass onto the solder-resist layer exposed through opening (72A), portions of the solder-resist layer will become thinner. The thickness of the solder-resist layer on pads (58b) and between pads (58b) is reduced. Such a method is called blast processing. In blast processing, there is a wet type and a dry type. As for a blast process, it is preferred to employ wet-type blast processing, in which a treatment solution containing an abrasive and water is blasted onto a substrate. By wet blasting, the solder-resist layer on pads 58 and between pads (58b) will become thinner. The upper surfaces of pads (58b) and part of the side walls of pads (58b) will be exposed by the solder-resist layer (FIG. 5(A)). The amount of solder-resist layer to be removed is preferred to be approximately 10-20 μm. The amount of the side walls of pads (58b) exposed by the solder-resist layer is preferred to be $1/10$-$9/10$ of the pad thickness. The upper surfaces of the pads will be exposed, but the interlayer resin insulation layer between pads (58b) will remain covered with the solder-resist layer. A magnified view of circled portion "C" in FIG. 5(A) is shown in FIG. 8(B). Other than using blast processing, a laser may also be used to expose the top portions of bonding pads (58b). In the present embodiment, multiple pads (58b) are exposed by the solder-resist layer through an opening (70A) formed in the solder-resist layer. Multiple openings (70A) to expose pads (58b) may be formed, provided that there are at least two or more pads (58b) to be exposed through each opening (70A). In FIG. 8(B), two pads (58b) are exposed through one opening (70A). The amount of the solder-resist layer to be made thinner may be controlled by adjusting the blast pressure and processing time when blasting the solder resist with a treatment solution and an abrasive.

(14) Using a laser, openings (70c) reaching solder pads (58p) are formed in upper-surface-side solder-resist layer 70, and openings (70d) reaching solder pads (58o) are formed in lower-surface-side solder-resist layer 70 (FIG. 5(B)). Opening (70c) and a solder pad are preferred to have a one-to-one relationship. The outer peripheries of solder pads are covered with the solder-resist layer. Among multiple conductive circuits and multiple via conductors, part of the conductive circuits and part of the via conductors may also function as solder pads. A magnified view of circled portion "C" in FIG. 5(B) is shown in FIG. 8(C). This case shows an example in which via conductors function as solder pads. Solder-resist layers having openings (70A) and openings (70c) are obtained. The above-described catalyst exists between the interlayer resin insulation layer and the solder-resist layer.

(15) A metal layer is formed on solder pads (58p) exposed by the solder-resist layer through openings (70c) and on pads (58b) exposed by the solder-resist layer through opening (70A) (FIG. 5(C)). Such a metal layer is preferred to contain electroless plated film which will be deposited through self catalysis. Examples of a metal layer are nickel, gold, palladium and tin electroless plated films. As specific metal layers, a nickel layer on pads (58b) and solder pads (58p) and a gold layer on the nickel layer, or a tin layer on pads (58b) and solder pads (58p) may be listed. A palladium layer may be formed between the nickel layer and the gold layer. A magnified view of circled portion "C" in FIG. 5(C) is shown in FIG. 8(D).

A magnified view of pads (58b) in FIG. 8(D) is shown in FIG. 9(A). FIG. 9(B) is a plan view of pads (58b) in FIG. 9(A). Both ends of the solder-resist layer between pads (58b) may be covered with a metal layer. Pads (58b) are configured to be substantially rectangular. Width (Wb) is set at 30-100 μm. Also, the distance (insulation distance (X2)) between adjacent pads (58b) is set at 10-50 μm. From the viewpoint of fine pitch and insulation reliability, distance (X2) between pads is preferred to be set at 15-35 μm. The distance (X1, see FIG. 9(A)) is preferred to be 10-40 μm between pad (58b) positioned next to the outer periphery of opening (70A) and the outer periphery of opening (70A). In the present embodiment, even if the insulation distance between pads (58b) is set at 10 μm, insulation reliability may be secured.

(16) Then, by providing solder balls on solder pads (58p) and conducting a reflow, solder bumps (solder bodies) (76U, 76D) are formed on the pads (FIG. 6). Electronic components such as ICs, memories, chip capacitors and the like may be mounted on a printed wiring board of the present embodiment. Electronic components such as ICs may be mounted on pads (58b) by means of wires, and electronic components such as ICs may be mounted on solder pads (58p) by means of solder bumps.

In a printed wiring board of the present embodiment and its manufacturing method, conductive circuits including pads (58b) are formed by a semi-additive method. After pads are formed, the interlayer resin insulation layer between pads is covered with solder-resist layer 70, and then the upper surfaces of pads are exposed by blasting or by a laser. In the present embodiment, multiple pads (58b) are exposed through an opening formed in the solder-resist layer, but the interlayer resin insulation layer between pads (58b) is covered with the solder-resist layer. When a metal layer is formed on pads (58b), the catalyst on the interlayer resin insulation layer is covered with the solder-resist layer. Therefore, the metal layer will hardly be deposited between pads (58b), leading to higher insulation reliability between pads (58b). Even if pads (58b) are positioned so as to set the insulation distance between pads (58b) at 50 μm or less, short-circuiting will seldom occur between adjacent pads (58b).

In the following, an example is shown using a semi-additive method for forming conductive circuits. A catalyst for copper electroless plating or the like is attached to a resin layer and then electroless plated film is formed on the interlayer resin insulation layer. Next, a plating resist is formed on the electroless plated film, and using the electroless plated film as a seed, electrolytic copper-plated film or the like is formed on the electroless plated film left exposed by the plating resist. Then, the plating resist is removed. After that, the electroless plated film between portions of the electrolytic plated film is removed. Using such a method, a catalyst remains on the resin layer as an interlayer resin insulation layer. In the present embodiment, the solder-resist layer between pads (58b) covers the interlayer resin insulation layer and the catalyst on the interlayer resin insulation layer.

In the present embodiment, a solder-resist layer is formed on interlayer resin insulation layer 50 between pads (58b). Therefore, when resin capsulation is conducted after wire bonding, the encapsulated resin will easily flow between bonding pads, and insulation reliability and connection reliability may be enhanced.

In addition, since the solder-resist layer between pads (58b) is lower than pads 58, the solder-resist layer will not hamper the wire-bonding process.

Figure 10:
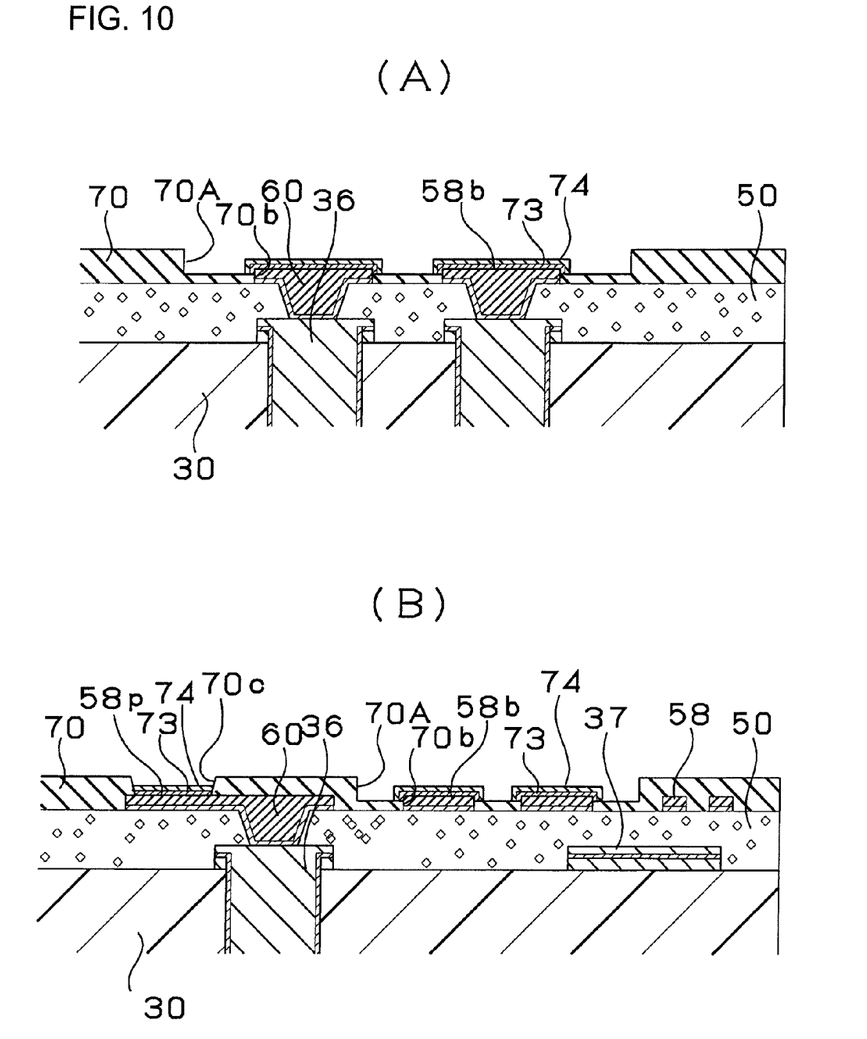
FIG. 10(A) is a cross-sectional view of a printed wiring board according to another embodiment.
FIG. 10(B) is a cross-sectional view of a printed wiring board showing an example of solder pads.

In the above-described embodiment, a structure is shown where one layer of interlayer resin insulation layer is formed. However, needless to say, the structure of the present embodiment may also be applied to a printed wiring board where two or more layers of interlayer resin insulation layers are formed. The solder-resist layer between solder pads (58p) may also be prepared in such a way that the upper surfaces and part of the side walls of solder pads (58p) are exposed, the same as the solder-resist layer between pads (58b). Such an example is shown in FIG. 10(A).

EXAMPLE

In the following, the steps for manufacturing a printed wiring board shown in FIG. 6 are described.

(1) Double-sided copper-clad laminate 31 with a thickness of 0.8 mm is prepared (FIG. 1(A)). Insulative substrate (core substrate) 30 of double-sided copper-clad laminate 31 is made of epoxy resin and a core material such as glass cloth. Copper foils (30A, 30B) are laminated on a first surface of core substrate 30 and on a second surface opposite the first surface. First, penetrating holes 32 for through-hole conductors are formed in the double-sided copper-clad laminate using a drill (FIG. 1(B)).

(2) Then, a palladium catalyst is attached to the surfaces of the double-sided copper-clad laminate and to the inner-wall surfaces of penetrating holes 32 for through-hole conductors (not shown in the drawings). Next, by immersing the core substrate in a commercially available electroless copper plating solution (such as THRU-CUP made by C. Uyemura & Co., Ltd.), 0.3-3.0 μm-thick electroless copper-plated film 34 is formed on the substrate surfaces and the inner walls of the penetrating holes (FIG. 1(C)).

(3) Next, by immersing in an electrolytic copper plating solution with the following composition, electrolytic plated film 35 is formed on both surfaces of the copper-clad laminate and inside the penetrating holes under the following conditions (FIG. 1(D)). The penetrating holes for through-hole conductors are filled with electrolytic copper-plated film.

| electrolytic plating solution | |
|---|---|
| sulfuric acid | 0.5 mol/l |
| copper sulfate | 0.8 mol/l |
| iron sulfate-heptahydrate | 5 g/l |
| leveling agent | 50 mg/l |
| brightener | 50 mg/l |

| electrolytic plating conditions | |
|---|---|
| current density | 1 A/dm$^2$ |
| time | 65 minutes |
| temperature | 22 ± 2° C. |

(4) An etching resist with a predetermined pattern is formed on electrolytic plated films 35. Electrolytic plated films 35, electroless plated films 34 and copper foils (30A, 30B) left exposed by the etching resist are etched away, and through-hole conductors 36 and conductive circuits 37 are formed (FIG. 2(A)). Then, the entire surface of conductive circuits 37 and the upper surfaces of through-hole conductors 36 are roughened (not shown in the drawings).

Forming Built-Up Layers (5) Resin film for interlayer resin insulation layers (brand name: ABF-45SH, made by Ajinomoto) is laminated on both surfaces of core substrate 30. Then, by curing the resin film for interlayer resin insulation layers, interlayer resin insulation layer 50 is formed on both surfaces of the core substrate (FIG. 2(B)).

(6) Next, using a $CO_2$ gas laser, via-conductor openings (50a) with an 80 μm diameter are formed in the interlayer resin insulation layers (FIG. 2(C)). Substrate 30 having via-conductor openings (50a) is immersed for 10 minutes in an 80° C. solution containing 60 g/l permanganic acid to roughen the surfaces of interlayer resin insulation layers 50 including the inner walls of via-conductor openings (50a) (not shown in the drawings).

(7) Next, substrate 30 is immersed in a neutralizer (made by Shipley Company, LLC) and then washed with water. Furthermore, a catalyst is attached to the surfaces of interlayer resin insulation layers 50 and the inner-wall surfaces of via-conductor openings (50a) (not shown in the drawings).

(8) Next, the substrate is immersed in a commercially available electroless copper plating solution to form 0.3-3.0 μm-thick electroless copper-plated film 52 on the surfaces of the interlayer resin insulation layers and inner walls of the via-conductor openings (FIG. 3(A)).

(9) Next, plating resist 54 with a predetermined pattern is formed on electroless copper-plated films 52 (FIG. 3(B)).

(10) The substrate is immersed in an electrolytic copper plating solution the same as in above (3). Electrolytic copper-plated film 56 is formed on electroless copper-plated films left exposed by the plating resists under substantially the same condition as above (3) (FIG. 3(C)). The thickness of electrolytic copper-plated film is 12 μm. Via-conductor openings are filled with electrolytic copper-plated film 56.

(11) The plating resists are removed and electroless plated films 52 between portions of electrolytic copper-plated film are removed by etching. Independent upper-layer conductive circuits 58, wire-bonding pads (58b), solder pads (58p, 58o) and filled vias 60 are formed (FIG. 4(A)). Then, the surfaces of upper-layer conductive circuits 58, wire-bonding pads (58b), solder pads (58p, 58o) and filled vias 60 are roughened (not shown in the drawings). FIG. 10(B) shows an example in which conductive circuits work as solder pads (58p).

(12) Next, on both surfaces of multilayer wiring substrate 300, a commercially available solder-resist composition (such as SR7200 made by Hitachi Chemical Co., Ltd.) 70 is applied to be approximately 20 μm thick (FIG. 4(B)), and a drying process is conducted under the conditions of 70° C. for 20 minutes and 70° C. for 30 minutes. Moreover, a heating process is conducted under the conditions of 80° C. for an hour, 100° C. for an hour, 120° C. for an hour and 150° C. for three hours respectively to cure the solder-resist composition. The thickness of solder-resist layers is approximately 20 μm.

(13) Next, metal mask 72 made of aluminum with openings (72A) positioned in areas corresponding to wire-bonding pads (58b) is placed (FIG. 4(C)). Then, by blasting a treatment solution containing an abrasive and water against the solder-resist layer exposed through openings (72A), the solder resist layer is removed by 10 μm. The upper surfaces of multiple wire-bonding pads 58 and part of the side walls of pads 58 will be exposed by the solder-resist layer through an opening formed in the solder-resist layer (FIG. 5(A)). The thickness of the solder-resist layer between wire-bonding pads (58b) is 10 μm, and the amount of the side walls to be exposed is 2 μm. In the present example, alumina oxide with an average abrasive particle diameter of 6.7 μm (4.0-20.0 μm) is used as an abrasive. An abrasive and water are mixed and the mixed solution is transferred to a blast gun using a slurry pump, and then blasted against the solder-resist layer by adding pressure with compressed air. In the present example, the blasting pressure is 0.2 MPa and the processing time is 15 minutes.

(14) Using a laser, openings (70c) reaching solder pads (58p) are formed in solder-resist layer 70 (FIG. 5(B)). Opening (70c) and a solder pad are preferred to have a one-to-one relationship.

(15) A nickel layer and a gold layer are formed in that order on solder pads (58p) exposed by the solder-resist layer through openings (70c) and on wire-bonding pads (58b) exposed by the solder-resist layer through opening (70A) (FIG. 5(C)). The nickel layer of the present example is formed by immersing the substrate in the following electroless nickel plating solution for 30 minutes. The thickness of the electroless nickel-plated layer is approximately 5 μm.

| electroless nickel plating solution | |
| --- | --- |
| nickel chloride | $2.3 \times 10^{-1}$ mol/l |
| sodium hypophosphite | $2.8 \times 10^{-1}$ mol/l |
| sodium citrate | $1.6 \times 10^{-1}$ mol/l |
| pH = 4.5 | |

The gold layer of the present example is formed by immersing the substrate in the following gold electroless plating solution for five minutes. The thickness of the gold-plated layer is approximately 0.05 μm.

| | |
| --- | --- |
| gold potassium cyanide | $7.6 \times 10^{-3}$ mol/l |
| ammonium chloride | $1.9 \times 10^{-1}$ mol/l |
| sodium citrate | $1.2 \times 10^{-1}$ mol/l |
| sodium hypophosphite | $1.7 \times 10^{-1}$ mol/l |

A magnified view of wire-bonding pads in FIG. 8(D) is shown in FIG. 9(A). FIG. 9(B) is a plan view of the wire-bonding pads in FIG. 9(A). Wire-bonding pad (58ba) is configured to be substantially rectangular, and its width (Wb) is 65 μm. In addition, distance (insulation distance) (X2) between adjacent pads (58b) is 20 μm. The distance (X1, see FIG. 9(A)) is 20 μm between pad (58b) positioned next to the outer periphery of opening (70A) and the periphery of opening (70A).

(16) After that, by providing solder balls on solder pads (58p) and conducting a reflow, solder bumps (solder bodies) (76U, 76D) are formed on pads (FIG. 6). Electronic components such as ICs, memories and the like are mounted on wire-bonding pads (58b) by means of wires, and electronic components such as ICs are mounted on solder pads (58p) by means of solder bumps.

A method for manufacturing a printed wiring board according to one aspect of the present invention is as follows: forming a pad for mounting an electronic component on a resin layer; forming a solder-resist layer on the resin layer and the pad; exposing the upper surface and part of the side wall of the pad by the solder-resist layer; and forming a metal layer on the exposed upper surface and part of the side wall of the pad.

A printed wiring board according to another aspect of the present invention is formed with the following: a resin layer; multiple pads formed on the resin layer on which to mount an electronic component; a solder-resist layer formed on the resin layer and exposing the upper surfaces and part of the side walls of the pads; and a metal layer formed on the upper surfaces and side walls of the pads exposed by the solder-resist layer.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a printed wiring board, comprising:
   forming a pad for mounting an electronic component on a resin layer;
   forming a solder-resist layer on the resin layer and the pad;
   exposing an upper surface of the pad and a portion of a side wall of the pad from the solder-resist layer; and
   forming a metal layer on the upper surface of the pad and the portion of the side wall of the pad,
   wherein the forming of a pad comprises attaching a catalyst on the resin layer, forming an electroless plated film on the resin layer, forming a plating resist on the electroless plated film, forming an electrolytic plated film on the electroless plated film left exposed from the plating resist, removing the plating resist, and removing the electroless plated film left exposed from the electrolytic plated film.

2. The method for manufacturing a printed wiring board according to claim 1, wherein the catalyst is made of palladium.

3. The method for manufacturing a printed wiring board according to claim 2, wherein the forming of a pad includes forming a conductive circuit and a solder pad at the same time as forming the pad, and the forming of a solder-resist layer includes forming the solder-resist layer on the conductive circuit and the solder pad as well.

4. The method for manufacturing a printed wiring board according to claim 3, further comprising forming an opening in the solder-resist layer to expose the solder pad, wherein the forming of a metal layer includes forming the metal layer on the solder pad exposed through the opening.

5. The method for manufacturing a printed wiring board according to claim 3, further comprising forming a solder bump on the solder pad, wherein the solder pad is a pad on which to flip-chip mount an electronic component.

6. The method for manufacturing a printed wiring board according to claim 1, wherein the exposing is conducted by blasting.

7. The method for manufacturing a printed wiring board according to claim 1, wherein the exposing is conducted by a laser.

8. The method for manufacturing a printed wiring board according to claim 7, wherein the forming of a pad includes forming a conductive circuit and a solder pad at the same time as forming the pad, and the forming of a solder-resist layer includes forming the solder-resist layer on the conductive circuit and the solder pad as well.

9. The method for manufacturing a printed wiring board according to claim 8, further comprising forming an opening in the solder-resist layer to expose the solder pad, wherein the forming of a metal layer includes forming the metal layer on the solder pad exposed through the opening.

10. The method for manufacturing a printed wiring board according to claim 8, further comprising forming a solder bump on the solder pad, wherein the solder pad is a pad on which to flip-chip mount an electronic component.

11. The method for manufacturing a printed wiring board according to claim 1, wherein the metal layer is formed with a nickel layer on a pad and a gold layer on the nickel layer.

12. The method for manufacturing a printed wiring board according to claim 1, wherein the metal layer is formed with a nickel layer on a pad, a palladium layer on the nickel layer, and a gold layer on the palladium layer.

13. The method for manufacturing a printed wiring board according to claim 1, wherein the metal layer is formed with a tin layer.

14. The method for manufacturing a printed wiring board according to claim 1, wherein the forming of a pad includes forming a conductive circuit and a solder pad at the same time as forming the pad, and the forming of a solder-resist layer includes forming the solder-resist layer on the conductive circuit and the solder pad as well.

15. The method for manufacturing a printed wiring board according to claim 14, further comprising forming an opening in the solder-resist layer to expose the solder pad, wherein the forming of a metal layer includes forming the metal layer on the solder pad exposed through the opening.

16. The method for manufacturing a printed wiring board according to claim 15, further comprising forming a solder bump on the solder pad, wherein the solder pad is a pad on which to flip-chip mount an electronic component.

17. The method for manufacturing a printed wiring board according to claim 16, wherein the solder-resist layer covers an outer periphery portion of the solder pad.

18. The method for manufacturing a printed wiring board according to claim 15, wherein the solder-resist layer covers an outer periphery portion of the solder pad.

19. The method for manufacturing a printed wiring board according to claim 1, wherein the pad is a wire-bonding pad.

* * * * *